US009263607B2

(12) United States Patent
Yoo et al.

(10) Patent No.: US 9,263,607 B2
(45) Date of Patent: Feb. 16, 2016

(54) PHOTODETECTOR USING GRAPHENE AND METHOD OF MANUFACTURING THE SAME

(71) Applicant: Samsung Electronics Co., Ltd., Suwon-si, Gyeonggi-do (KR)

(72) Inventors: Won Jong Yoo, Suwon-si (KR); Hua-Min Li, Suwon-si (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 54 days.

(21) Appl. No.: 13/747,920

(22) Filed: Jan. 23, 2013

(65) Prior Publication Data

US 2013/0285018 A1    Oct. 31, 2013

(30) Foreign Application Priority Data

Apr. 27, 2012  (KR) .................. 10-2012-0044667

(51) Int. Cl.
| H01L 29/06 | (2006.01) |
| H01L 31/028 | (2006.01) |
| H01L 31/0232 | (2014.01) |
| H01L 31/036 | (2006.01) |
| H01L 31/112 | (2006.01) |
| B82Y 99/00 | (2011.01) |
| B82Y 15/00 | (2011.01) |

(52) U.S. Cl.
CPC .......... *H01L 31/028* (2013.01); *H01L 31/0232* (2013.01); *H01L 31/036* (2013.01); *H01L 31/112* (2013.01); *B82Y 15/00* (2013.01); *B82Y 99/00* (2013.01); *Y02E 10/547* (2013.01); *Y10S 977/734* (2013.01); *Y10S 977/773* (2013.01)

(58) Field of Classification Search
CPC .................................................. H01L 31/028
USPC ............................................................ 257/29
See application file for complete search history.

(56) References Cited

U.S. PATENT DOCUMENTS

| 8,274,098 B2 | 9/2012 | Chung et al. |
| 2010/0200839 A1 | 8/2010 | Okai et al. |

(Continued)

FOREIGN PATENT DOCUMENTS

| JP | 2009277803 A | 11/2009 |
| JP | 2010021377 A | 1/2010 |

(Continued)

OTHER PUBLICATIONS

Echtermeyer, et al., Strong plasmonic enhancement of photvoltage in graphene, Nature Communications, Published Aug. 30, 2011, 2:458I DOI:10.1038/ncomms1464, pp. 1-5.

(Continued)

*Primary Examiner* — Samuel Gebremariam
(74) *Attorney, Agent, or Firm* — Cantor Colburn LLP

(57) ABSTRACT

A photodetector using graphene includes: a gate electrode; a graphene channel layer which is opposite to and spaced apart from the gate electrode and does not have π-binding; a first electrode which contacts a first side of the graphene channel layer; and a second electrode which contacts a side of the graphene channel layer, where the first and second sides are opposite to each other, and where the graphene channel layer includes a first graphene layer and a first nanoparticle disposed on the first graphene layer. The first graphene layer may include a single graphene layer, or the first graphene layer may include a plurality of single graphene layers, which is sequentially stacked and does not have π-binding.

31 Claims, 16 Drawing Sheets

(56) References Cited

U.S. PATENT DOCUMENTS

| | | | |
|---|---|---|---|
| 2011/0042650 A1 | 2/2011 | Avouris et al. | |
| 2011/0102068 A1 | 5/2011 | Bouchiat et al. | |
| 2011/0116168 A1* | 5/2011 | Nikoobakht | 359/585 |
| 2011/0156007 A1 | 6/2011 | Otsuji et al. | |
| 2013/0320303 A1* | 12/2013 | Lin et al. | 257/29 |

FOREIGN PATENT DOCUMENTS

| | | |
|---|---|---|
| JP | 2010153793 A | 7/2010 |
| JP | 2011114299 A | 6/2011 |
| KR | 1020080109549 A | 12/2008 |
| KR | 1020100093965 A | 8/2010 |
| KR | 1020110020443 A | 3/2011 |

OTHER PUBLICATIONS

Korean Office Action with English Translation for Application No. 10-2012-0044667 dated Feb. 5, 2015.

Zhang, et al., Direct observation of a widely tunable bandgap in bilayer garphene, Nature Letters, vol. 459, Jun. 11, 2009, pp. 820-823.

Watcharinyanon, et al., Hydrogen intercalation of graphene grown on 6H-SiC(0001), Linkoping University Post Print pp. 1-20, Original Publication: Somsakul Watcharinyanon, Chariya Virojanadara, Jacek Osiecki, A A Zakharov, Rositsa Yakimova, Roger Uhrberg and Leif I Johansson, Hydrogen intercalation of graphene grown on 6H-SiC(0001), 2011, Surface Science, (605), 17-18, 1662-1668. http://dx.doi.org/10.1016/j.susc.2010.12.018.

Miyazaki, et al., Inter-Layer Screening Length to Electric Field in Thin Graphite Film, E-mail address: tsuka@riken.jp (2008) pp. 1-5.

Ben-Jamaa, et al., An Efficient Gate Library for Ambipolar CNTFET Logic, IEEE Transactions on Computer-Aided Design of Integrated Circuits and Systems, vol. 30, No. 2, Feb. 2011, pp. 242-255.

A.N. Pal et al., "Ultralow noise field-effect transistor from multilayer graphene", Applied Physics Letters, vol. 95, 082105 pp. 1-3, 2009.

Atwater, et al., Plasmonics for improved photovoltaic devices, Nature Materials, vol. 9, Mar. 2010, pp. 205-213.

D. Kondo et al., "Low-Temperature Synthesis of Graphene and Fabrication of Top-Gated Field Effect Transistors without Using Transfer Processes", Applied Physics Express, vol. 3, No. 025102, pp. 1-3, 2010.

F. Schwierz, "Graphene transistors", Nature Nanotechnology, vol. 5, pp. 487-496, Jul. 2010.

F. Xia et al., "Ultrafast graphene photodetector", Nature Nanotechnology, vol. 4, pp. 839-843, Dec. 2009.

S. Pillai et al., "Plasmonics for photovoltaic applications", Solar Energy Materials & Solar Cells, vol. 94, pp. 1481-1486, 2010.

T. Mueller et al., "Graphene photodetectors for high-speed optical communications", Nature Photonics, vol. 4, pp. 297-301, May 2010.

T.J. Echtermeyer et al., "Strong plasmonic enhancement of photovoltage in graphene", Nature Communications, vol. 2, No. 458, pp. 1-5, 2011.

Y. Ouyang et al., "Multilayer Graphene Nanoribbon for 3D Stacking of the Transistor Channel", IEEE IEDM, pp. 893-896, 2009.

Y. Sui et al., "Screening and Interlayer Coupling in Multilayer Graphene Field-Effect Transistors", Nano Letters, vol. 9, No. 8, pp. 2973-2977, 2009.

\* cited by examiner

PHOTODETECTOR USING GRAPHENE AND METHOD OF MANUFACTURING THE SAME

CROSS-REFERENCE TO RELATED APPLICATIONS

This application claims priority to Korean Patent Application No. 10-2012-0044667, filed on Apr. 27, 2012, and all the benefits accruing therefrom under 35 U.S.C. §119, the content of which in its entirety is herein incorporated by reference.

BACKGROUND

1. Field

The disclosure relates to optical devices, and more particularly, to a photodetector using graphene and a method of manufacturing the photodetector.

2. Description of the Related Art

Graphene has higher electron mobility and higher hole mobility than materials known previously. In addition, graphene may have a high Fermi velocity that is close to about 1/300 of light speed. Graphene may respond to light having a wide wavelength bandwidth from an infrared domain to an ultraviolet domain. Such characteristics of graphene may be applied to various fields, and thus, graphene may be used for various products. For example, if graphene is used as channels of transistors, carrier mobility of the transistor may be much faster than that of silicon transistors. In addition, graphene may be used as channels of photodetectors.

However, a single layer of graphene has relatively low efficiency as well as relatively low photon absorbance compared to other bulk materials. Accordingly, photocurrent generation may be decreased, and photo-responsivity may be also low.

A multi-graphene layer having $\pi$-binding may be used to solve such problems of a single graphene layer. However, in the multi-graphene layer, carrier mobility may be lowered due to $\pi$-binding between graphene layers and merits of a single graphene layer may not be sufficiently provided.

SUMMARY

Provided are photodetectors including a multi-graphene layer, which does not have $\pi$-binding but has similar characteristics of a single graphene layer, as a channel thereof.

Provided are methods of manufacturing the photodetectors.

Additional aspects will be set forth in part in the description which follows and, in part, will be apparent from the description, or may be learned by practice of the presented embodiments.

According to an embodiment of the invention, a photodetector includes: a gate electrode; a graphene channel layer which is opposite to and spaced apart from the gate electrode and does not have $\pi$-binding; a first electrode which contacts a first side of the graphene channel layer; and a second electrode which contacts a second side of the graphene channel layer, where the first and second sides are opposite to each other, and where the graphene channel layer includes: a first graphene layer; and a first nanoparticle disposed on the first graphene layer.

In an embodiment, the first graphene layer may include a single graphene layer.

In an embodiment, the first graphene layer may include a plurality of layers, which is sequentially stacked and does not have $\pi$-binding.

In an embodiment, the photodetector may further include a second nanoparticle between the plurality of graphene layers.

In an embodiment, the first nanoparticle and the second nanoparticle may be the same as or different from each other.

In an embodiment, the graphene channel layer may further include a second graphene layer which covers the first nanoparticle on the first graphene layer.

In an embodiment, the second graphene layer may include a single graphene layer.

In an embodiment, the second graphene layer may include a plurality of graphene layers, which is sequentially stacked and does not have $\pi$-binding.

In an embodiment, the photodetector may further include a third nanoparticle between the plurality of graphene layers included in the second graphene layer.

In an embodiment, the first nanoparticle and the third nanoparticle may be the same as or different from each other.

In an embodiment, the gate electrode may include a P-type or N-type silicon electrode.

In an embodiment, the gate electrode may be disposed above or under the graphene channel layer.

According to another embodiment of the invention, a method of manufacturing a photodetector includes: providing a graphene channel layer; providing a gate electrode which is opposite to the graphene channel layer; providing a first electrode which is spaced apart from the gate electrode and contacts a first side of the graphene channel layer; and providing a second electrode which is spaced apart from the gate electrode and contacts a second side of the graphene channel layer, where the first and second sides are opposite to each other, and where the providing the graphene channel layer may include: providing a first graphene layer which does not have $\pi$-binding; and providing a first nanoparticle on the first graphene layer.

In an embodiment, the gate electrode may be provided above or under the graphene channel layer.

In an embodiment, the providing the first graphene layer may include: forming a single graphene layer; and transferring the formed single graphene layer to a location where the graphene channel layer is to be provided.

In an embodiment, the providing the first graphene layer may include: forming a first single graphene layer; transferring the formed first single graphene layer to a location where the graphene channel layer is to be provided; forming a second single graphene layer; and transferring the formed second single graphene layer onto the first single graphene layer.

In an embodiment, the providing the first graphene layer may further include providing a second nanoparticle on the first single graphene layer before the transferring the second single graphene layer onto the first single graphene layer.

In an embodiment, the first nanoparticle and the second nanoparticle may be the same as or different from each other.

In an embodiment, the providing the graphene channel layer may further include providing a second graphene layer which covers the first nanoparticle on the first graphene layer.

In an embodiment, the providing the second graphene layer may include: forming a third single graphene layer; and transferring the formed third single graphene layer onto the first graphene layer to cover the first nanoparticle.

In an embodiment, the providing the second graphene layer may include: forming a fourth single graphene layer; transferring the formed fourth single graphene layer onto the first graphene layer to cover the first nanoparticle; forming a fifth single graphene layer; and transferring the formed fifth single graphene layer onto the fourth single graphene layer.

In an embodiment, the providing the second graphene layer may further include providing a third nanoparticle on the fourth single graphene layer before the transferring the fifth single graphene layer onto the fourth single graphene layer.

In an embodiment, the first nanoparticle and the third nanoparticle may be the same as or different from each other.

In an embodiment, a single graphene layer may be further provided on the second single graphene layer.

In an embodiment, the providing the graphene channel layer may further include: forming another nanoparticle on the second graphene layer; and providing a graphene layer which covers the other nanoparticle on the second graphene layer.

In an embodiment, a single graphene layer may be further provided on the fifth single graphene layer.

In an embodiment, the providing the first nanoparticle on the first graphene layer may include: forming a metal layer to provide the first nanoparticle on the first graphene layer; and annealing the metal layer.

An embodiment of a photodetector according to the invention includes a graphene channel, in which a plurality of single graphene layers is stacked. The graphene channel is provided by simply stacking the plurality of single graphene layers. The plurality of single graphene layers is simply physically stacked, and chemical binding, for example, π-binding, does not exist the plurality of single graphene layers. In such an embodiment, the graphene channel has zero bandgap and ambipolar characteristics without mobility degradation. Accordingly, carrier transport capability of the photodetector is substantially improved.

In an embodiment, nanoparticles that cause plasmon resonance exist between the single graphene layers. Incident light is scattered due to the nanoparticles, and consequently, a range in which the incident light is irradiated may be wider. Accordingly, a local field around the nanoparticles may be strengthened, photon absorbance increases in proportion to the number of the single graphene layers, and thus, photocurrent generation may be increased. Thus, photo-reactivity of the photodetector is substantially increased.

BRIEF DESCRIPTION OF THE DRAWINGS

These and/or other features will become apparent and more readily appreciated from the following description of the embodiments, taken in conjunction with the accompanying drawings in which.

DETAILED DESCRIPTION

Figure 1:
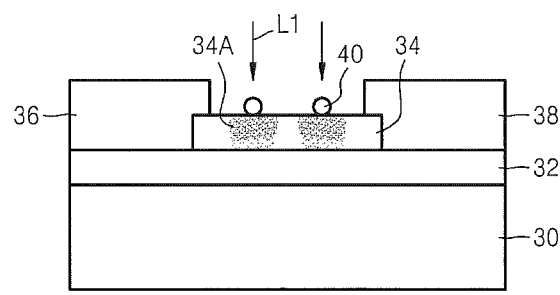
FIG. 1 is a cross-sectional view of an embodiment of a photodetector using graphene according to the invention.

The invention will be described more fully hereinafter with reference to the accompanying drawings, in which exemplary embodiments of the invention are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms, "a", "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the claims set forth herein.

All methods described herein can be performed in a suitable order unless otherwise indicated herein or otherwise clearly contradicted by context. The use of any and all examples, or exemplary language (e.g., "such as"), is intended merely to better illustrate the invention and does not pose a limitation on the scope of the invention unless otherwise claimed. No language in the specification should be construed as indicating any non-claimed element as essential to the practice of the invention as used herein.

Embodiments of a photodetector using graphene and a method of manufacturing the photodetector according to the invention will now be described in detail with reference to the accompanying drawings. In the drawings, thicknesses of layers and regions are exaggerated for clarity.

First, an embodiment of a photodetector using graphene according to the invention will now be described.

FIG. 1 is a cross-sectional view of an embodiment of a photodetector using graphene according to the invention.

Referring to FIG. 1, in an embodiment of the photodetector using graphene, an insulation layer 32 is disposed on a substrate 30. The substrate 30 may be a doped semiconductor substrate. In one embodiment, for example, the substrate 30 may be a silicon substrate in which P-type or N-type impurities are doped. The substrate 30 may be used as a gate electrode to which a gate voltage is applied. The insulation layer 32 may be a gate insulation layer. The insulation layer 32 may be, for example, a $SiO_2$ layer or another silicon oxide layer. In such an embodiment, the insulation layer 32 may be a nitride layer.

A first channel layer 34 is disposed on the insulation layer 32. The first channel layer 34 may be a single graphene layer. First and second electrodes 36 and 38 are disposed on the insulation layer 32. The first electrode 36 contacts one side of the first channel layer 34. The second electrode 38 contacts another side of the first channel layer 34. The first and second electrodes 36 and 38 may face each other across the first channel layer 34. One of the first and second electrodes 36 and 38 may be a source electrode, and the other of the first and second electrodes 36 and 38 may be a drain electrode. The first and second electrodes 36 and 38 may be disposed spaced apart from each other on the first channel layer 34. In an embodiment, the first and second electrodes 36 and 38 may be, for example, aluminum electrodes, but not being limited thereto. In an alternative embodiment, the first and second electrodes 36 and 38 may be electrodes including another metal or electrodes including an alloy. In an embodiment, the first and second electrodes 36 and 38 may include another material.

A first nanoparticle 40 exists on the first channel layer 34 between the first and second electrodes 36 and 38. A plurality of first nanoparticles may exist on the first channel layer 34. The diameter of the first nanoparticle 40 may be in the range of several nanometers to several hundred nanometers. In one embodiment, for example, the diameter of the first nanoparticle 40 may be in the range of several tens of nanometers to several hundred nanometers, or may be smaller than about 500 nanometers (nm). The diameter of the first nanoparticle 40 may vary depending on the type of material. The first nanoparticle 40 may be, for example, a gold (Au) particle or a silver (Ag) particle. Light L1 that is incident on the first channel layer 34 may cause plasmon resonance by interacting with the first nanoparticle 40. Thus, the incident light L1 may be widely scattered in a forward direction due to the first nanoparticle 40, and thus, the light L1 incident on the first nanoparticle 40 may be incident on a portion 34A of the first channel layer 34 around the first nanoparticle 40. In such a manner, since the first nanoparticle 40 allows the incident light L1 to be irradiated on a wider area by being scattered, the first nanoparticle 40 may be represented as a light scattering particle or a plasma resonance particle. Since a local field around the first nanoparticle 40 may be strengthened due to the first nanoparticle 40, photocurrent generation may also increase.

Figure 2A:
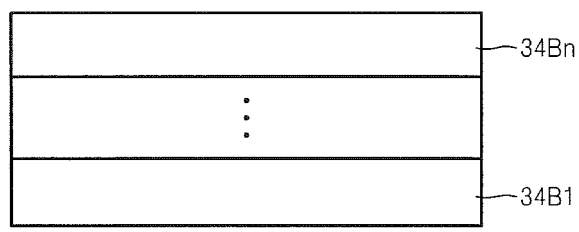
FIGS. 2A and 2B are cross-sectional views illustrating a layer structure of an embodiment of a first channel layer of FIG. 1.
Figure 2B:
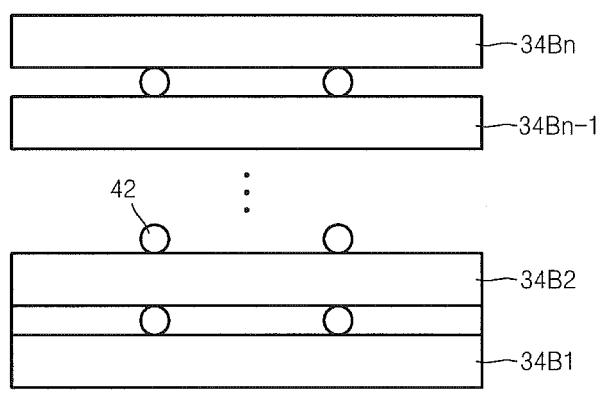

FIGS. 2A and 2B are cross-sectional views illustrating a layer structure of an embodiment of a first channel layer of FIG. 1. The first channel layer 34 may include a plurality of single graphene layers 34B1 through 34Bn (where, n is 1, 2, 3, . . . ) that are simply stacked in order as illustrated in FIGS. 2A and 2B. In such an embodiment, the plurality of single graphene layers 34B1 through 34Bn may be simply stacked in order without any nanoparticles therebetween as illustrated in FIG. 2A. The plurality of graphene layers 34B1 through 34Bn do not have π-binding as the plurality of graphene layers 34B1 through 34Bn are provided by simply stacking single graphene layers. The plurality of single graphene layers 34B1 through 34Bn may further include a second nanoparticle 42 or a second light scattering particle therebetween as illustrated in FIG. 2B. A plurality of second nanoparticles 42 may exist between the plurality of single graphene layers 34B1 through 34Bn. A function of the second nanoparticle 42 may be substantially the same as a function of the first nanoparticle 40 disposed on the first channel layer 34. The second nanoparticle 42 may be the same as or different from the first nanoparticle 40 existing on the first channel layer 34.

Figure 3:
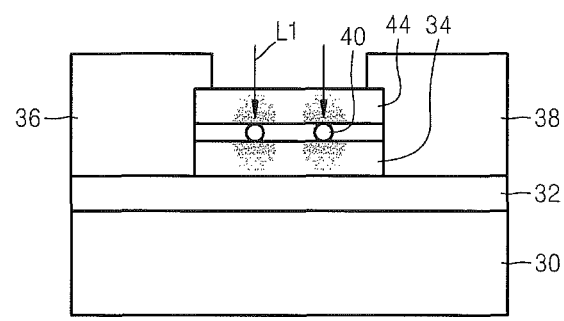
FIG. 3 is a cross-sectional view of an alternative embodiment of a photodetector using graphene according to the invention.

FIG. 3 is a cross-sectional view of an alternative embodiment of a photodetector using graphene according to the invention. Referring to FIG. 3, the photodetector may further include a second channel layer 44 covering the first nanoparticle 40 on the first channel layer 34. The second channel layer 44 may be a single graphene layer. In such an embodiment, the second channel layer 44 may be a layer provided, e.g., formed, by simply stacking a plurality of single graphene layers without π-binding. When the second channel layer 44 has a layer structure including a plurality of single graphene layers, the layer structure of the second channel layer 44 may be similar to or the same as the layer structure of the first channel layer 34 illustrated in FIGS. 2A and 2B. The first nanoparticle 40 scatters the incident light L1 in forward and backward directions of the incident light L1. Light scattered in the forward direction due to the first nanoparticle 40 is irradiated onto the first channel layer 34, and light scattered in the backward direction is irradiated onto the second channel layer 44. In such a manner, due to the first nanoparticle 40 disposed between the first and second channel layers 34 and 44, areas of the first and second channel layers 34 and 44, on which light is irradiated, may be wider compared to when there is no first nanoparticle 40. Thus, in the first and second channel layers 34 and 44, the intensity of a local field around the first nanoparticle 40 is substantially improved. As a result, photon absorbance of the first and second channel layers 34 and 44 increases, and thus, photocurrent generation substantially increases.

Figure 4:
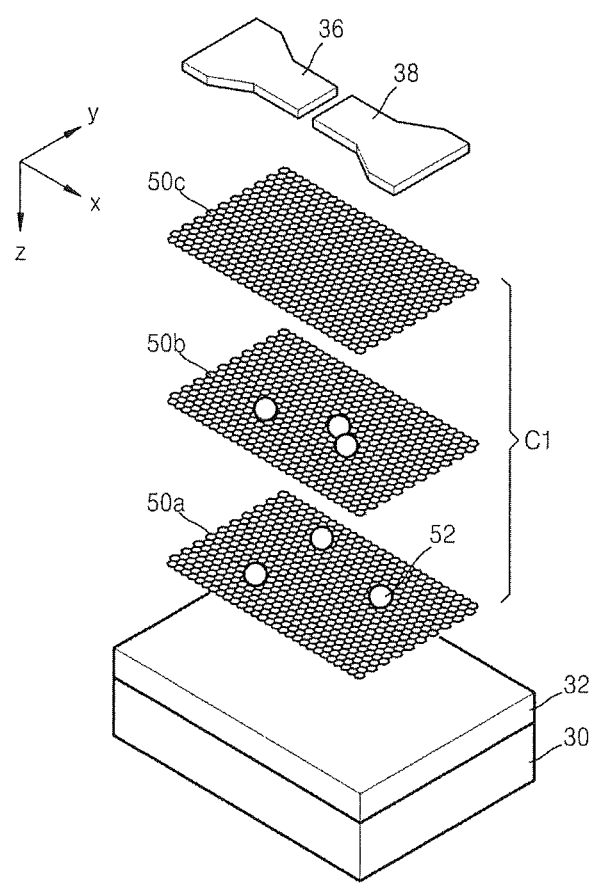
FIG. 4 is an exploded perspective view of an embodiment of a photodetector using graphene, where a channel layer includes three simply and sequentially stacked single graphene layers and nanoparticles.

FIG. 4 is an exploded perspective view of an embodiment of a photodetector using graphene, where a channel layer C1 includes simply and sequentially stacked first through third single graphene layers 50a, 50b and 50c and nanoparticles 52.

Referring to FIG. 4, the channel layer C1 does not include π-binding since the channel layer C1 includes the simply and sequentially stacked first through third single graphene layers 50a, 50b and 50c. In the channel layer C1, the nanoparticles 52 are disposed between the first single graphene layer 50a and the second single graphene layer 50b and between the second single graphene layer 50b and the third single graphene layer 50c. In such an embodiment, first and second electrodes 36 and 38 are disposed on the third single graphene layer 50c.

Figure 5:
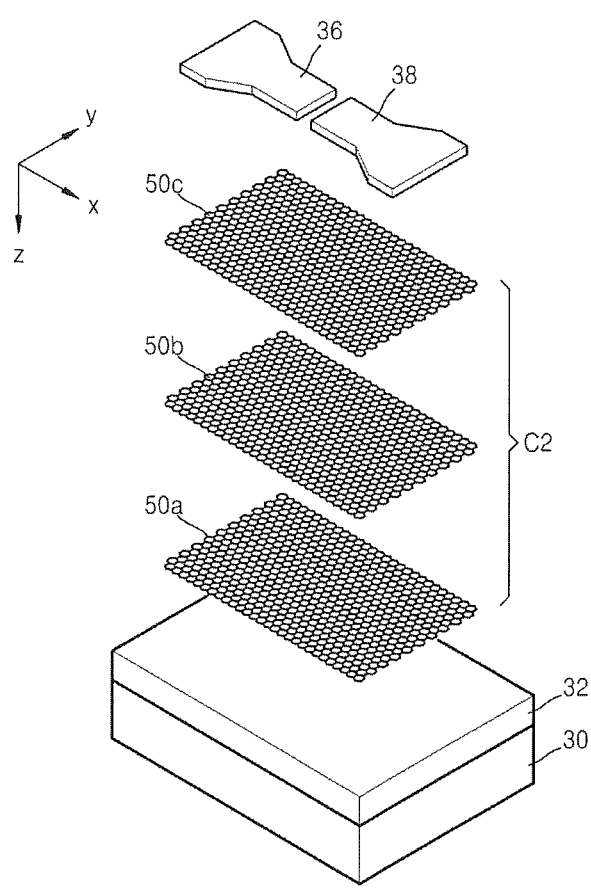
FIG. 5 is an exploded perspective view of an embodiment of a photodetector using graphene, where a channel layer includes only three simply stacked single graphene layers without nanoparticles.

The channel layer C1 may not include the nanoparticles 52 but may include only the simply and sequentially stacked first through third single graphene layers 50a, 50b and 50c. FIG. 5 is an exploded perspective view of an embodiment of a photodetector using graphene, where a channel layer includes only three simply stacked single graphene layers without nanoparticles. Referring to FIG. 5, a channel layer C2 includes only the simply and sequentially stacked first through third single graphene layers 50a, 50b and 50c without π-binding and does not include any nanoparticles. The channel layer C2 that includes the first through third single graphene layers 50a, 50b and 50c without π-binding has the same electrical characteristics as a single graphene layer, such as having the Dirac point and ambipolar characteristics. Thus, the photodetector illustrated in FIG. 5 may have carrier mobility similar to the carrier mobility of a photodetector having a channel that is a single graphene layer. In such an embodiment, since the channel layer C2 includes a plurality of single graphene layers, i.e., the first through third single graphene layers 50a, 50b and 50c as in the embodiment of the photodetector illustrated in FIGS. 3 and 4, photon absorbance and photocurrent generation may increase.

Figure 6:
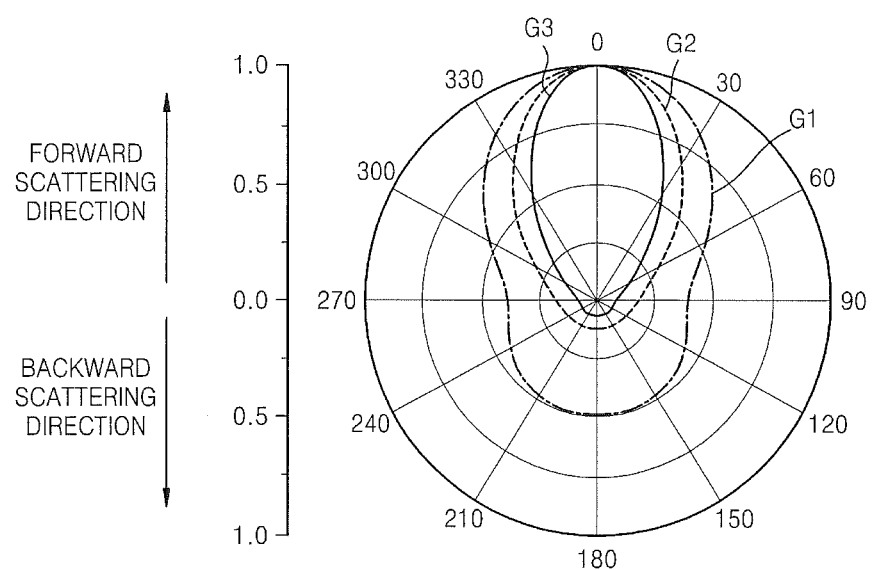
FIGS. 6 and 7 are distribution charts illustrating light scattering characteristics according to a diameter of a nanoparticle included in a channel layer of an embodiment of the photodetector according the invention.

FIG. 6 is a light scattering distribution chart illustrating light scattering characteristics according to a diameter of a nanoparticle when the nanoparticle included in a channel layer of an embodiment of the photodetector according to the invention is a gold (Au) particle. In FIG. 6, numerical values of the circumference of a circle indicate angles. Numerical values, e.g., 0.5, 1.0, etc., of forward and backward scattering directions in the left side of FIG. 6 indicate relative depths of scattering. In FIG. 6, a position of the nanoparticle is the center of the circle. In FIG. 6, a first distribution curve G1 illustrates a forward and backward scattering distribution of light when the diameter of the nanoparticle is about 50 nm. A second distribution curve G2 illustrates a forward and backward scattering distribution of light when the diameter of the nanoparticle is about 100 nm. In FIG. 6, a third distribution curve G3 illustrates a forward and backward scattering distribution of light when the diameter of the nanoparticle is about 150 nm.

Referring to the first through third distribution curves G1 through G3 of FIG. 6, as the diameter of the nanoparticle is smaller, the extent of scattering is wider in the forward and backward directions, and a depth of scattering in the backward direction is larger. However, a depth of scattering in the forward direction is substantially the same, which is independent of the diameter of the nanoparticle. When the diameter of the nanoparticle is about 100 nm or about 150 nm, the extent and depth of scattering in the backward direction due to the nanoparticle are very small compared to the extent and depth of scattering in the forward direction. As shown in FIG. 6, in an embodiment where a channel layer includes a simply stacked plurality of single graphene layers and a nanoparticle, a diameter of the nanoparticle may be set substantially small or effectively minimized. In an embodiment, the diameter of the nanoparticle is smaller than about 100 nm.

Figure 7:
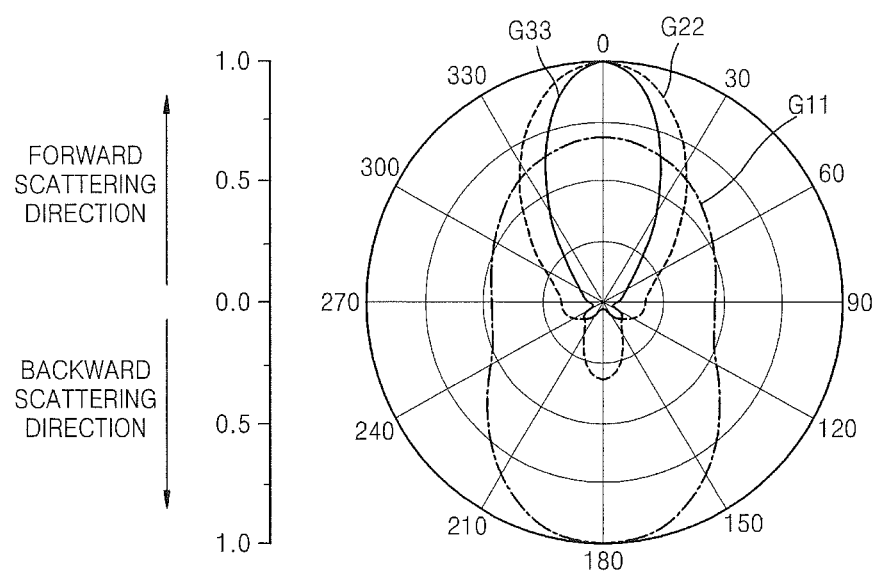

FIG. 7 is a light scattering distribution chart illustrating light scattering characteristics according to a diameter of a nanoparticle when the nanoparticle included in a channel layer of an embodiment of the photodetector according to the invention is a silver (Ag) particle. Numerical values in the light scattering distribution chart of FIG. 7 are the same as those described in relation to FIG. 6. A position of the nanoparticle is the center of the circle. In FIG. 7, a first distribution curve G11 illustrates a forward and backward scattering distribution of light when the diameter of the nanoparticle is about 50 nm. A second distribution curve G22 illustrates a forward and backward scattering distribution of light when the diameter of the nanoparticle is about 100 nm. In FIG. 7, a third distribution curve G33 illustrates a forward and backward scattering distribution of light when the diameter of the nanoparticle is about 150 nm.

Referring to the first through third distribution curves G11 through G33 of FIG. 7, as the diameter of the nanoparticle is smaller, the extent of scattering is wider in the forward and backward scattering directions, and a depth of scattering in the backward direction is also larger. However, a depth of scattering in the forward direction is smallest when the diameter of the nanoparticle is about 50 nm, and is the same when the diameter of the nanoparticle is about 100 nm, as when the diameter of the nanoparticle is about 150 nm. When the diameter of the nanoparticle is about 100 nm or about 150 nm, the extent and depth of scattering in the backward direction due to the nanoparticle are substantially small compared to those of scattering in the forward direction. Accordingly, in an embodiment where a channel layer including a simply stacked plurality of single graphene layers and a nanoparticle, for the diameter of the nanoparticle may be set substantially small or effectively minimized. In an embodiment, the nanoparticle may have a diameter smaller than about 100 nm. In an alternative embodiment, the nanoparticle may have a diameter that is equal to or greater than about 100 nm based on a consideration on the depth of scattering in the forward direction.

Figure 8A:
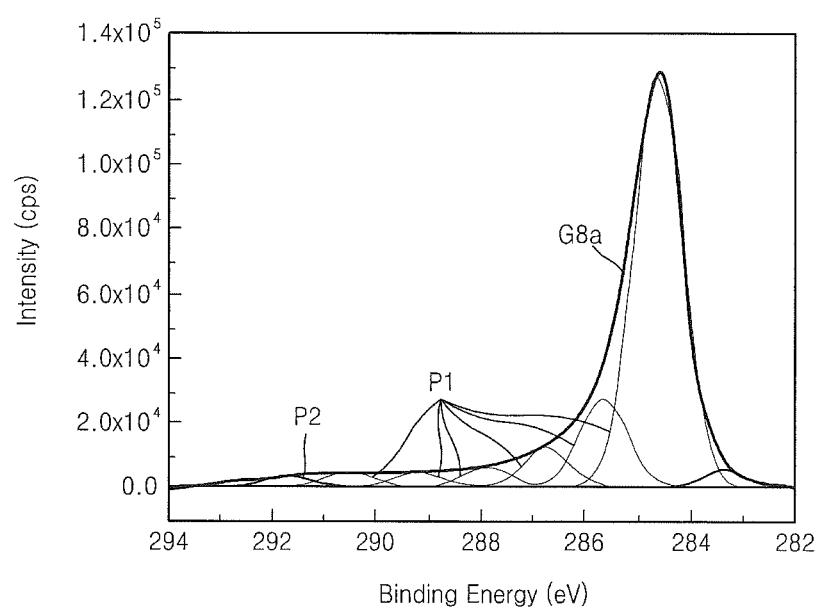
FIG. 8A is a graph showing a result of X-ray photoelectron spectrum analysis of a graphene channel layer of a conventional photodetector.
Figure 8B:
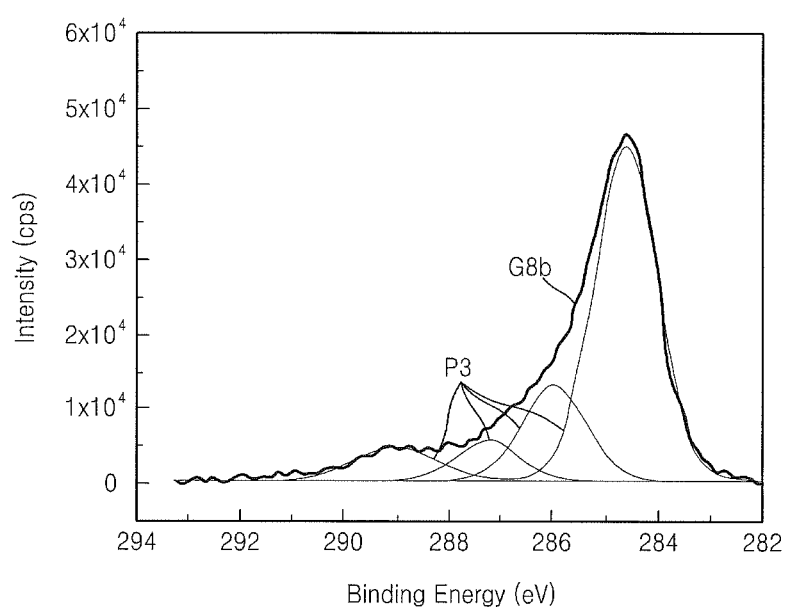
FIG. 8B is a graph showing a result of X-ray photoelectron spectrum analysis of a graphene channel layer of an embodiment of the photodetector according to the invention.

FIG. 8A is a graph showing results of X-ray photoelectron spectrum analysis of a graphene channel layer of a conventional photodetector, and FIG. 8B is a graph showing results of X-ray photoelectron spectrum analysis of a graphene channel layer of an embodiment of the photodetector according to the invention. As shown in FIGS. 8A and 8B, no π-binding exists in the graphene channel layer of an embodiment of the photodetector according to the invention.

The graphene channel layer of the conventional photodetector is formed by using a conventional method of stripping a highly ordered pyrolytic graphite ("HOPG"), and includes ten graphene layers sequentially formed by a mutual chemical combination.

The graphene channel layer of an embodiment of the photodetector according to the invention is provided by forming each of three single graphene layers and then simply stacking the three single graphene layers. In FIGS. 8A and 8B, the horizontal axis indicates combination energy (electron volt: eV), and the vertical axis indicates intensity (count per second: cps).

A first graph G8a shown in FIG. 8A indicates a result of X-ray photoelectron spectrum analysis of the graphene channel layer of the conventional photodetector. A plurality of first peaks P1 indicated by a thin line and a second peak P2 indicated by a thick line, which are distributed inside the first graph G8a, are peaks obtained by dividing the first graph G8a. Thus, the first graph G8a may be formed of the plurality of first peaks P1 and the second peak P2. The plurality of first peaks P1 correspond to the carbon of the graphene channel layer, and positions of the plurality of first peaks P1 are changed according to a position of the carbon. The second peak P2 is a peak corresponding to π-binding of single graphene layers included in the graphene channel layer. The existence of the second peak P2 in the first graph G8a indicates that π-binding exists in the graphene channel layer.

A second graph G8b shown in FIG. 8B indicates a result of X-ray photoelectron spectrum analysis of the graphene channel layer of an embodiment of the photodetector according to the invention. A plurality of third peaks P3 distributed inside the second graph G8b are peaks obtained by dividing the second graph G8b. Thus, the second graph G8b may be formed of the plurality of third peaks P3. The second graph G8b does not include a peak corresponding to the second peak P2 of FIG. 8A. Such a result indicates that π-binding does not exist in the graphene channel layer of an embodiment of the photodetector according to the invention.

Figure 9:
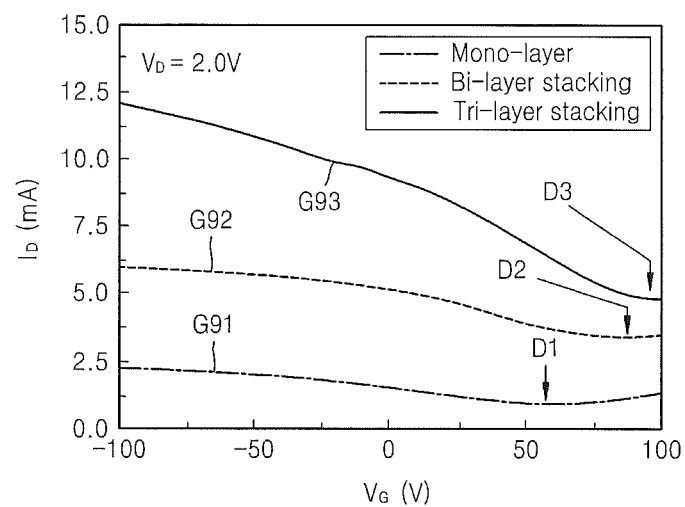
FIG. 9 is a graph illustrating current-voltage characteristics of an embodiment of the photodetector according to the invention.

FIG. 9 is a graph illustrating current-voltage characteristics of an embodiment of the photodetector according to the invention. In FIG. 9, the current-voltage graphs are obtained by applying about 2.0 volts (V) to the second electrode 38 as a drain voltage $V_D$ and maintaining voltage applied to the second electrode 38 until measurement was completed. In FIG. 9, a horizontal axis indicates a gate voltage $V_G$ (V) applied to the substrate 30 that is used as a gate electrode. A vertical axis indicates a drain current $I_D$ (milliampere: mA). In FIG. 9, a first graph G91 indicates a result when the graphene channel layer is a single graphene layer, a second graph G92 indicates a result when the graphene channel layer includes two single graphene layers, and a third graph G93 indicates a result when the graphene channel layer includes three single graphene layers.

Referring to FIG. 9, the first through third graphs G91 through G93 have Dirac points D1, D2 and D3, respectively, in the range of a positive gate voltage. As it goes from the first graph G91 to the third graph G93, a position of a Dirac point is moved to the right side. That is, a gate voltage of a Dirac point increases as it goes from the first graph G91 to the third graph G93. Accordingly, as shown in FIG. 9, a gate voltage of a Dirac point of the graphene channel layer may increase as the number of single graphene layers included in the graphene channel layer increases. A phenomenon in which a gate voltage of a Dirac point of the graphene channel layer increases as the number of single graphene layers included in the graphene channel layer increases indicates a P-type doping effect of the graphene channel layer. In FIG. 9, referring to the first through third graphs G91 through G93, a drain current is measured both when the gate voltage $V_G$ is a positive voltage and when the gate voltage $V_G$ is a negative voltage, and thus indicates ambipolar characteristics.

Based on a result as shown in FIG. 9, in an embodiment, the graphene channel layer including a simply stacked plurality of single graphene layers may have similar characteristics as a single graphene layer, as the graphene channel layer of an embodiment of the photodetector according to the invention has a Dirac point and ambipolar characteristics.

Figure 10:
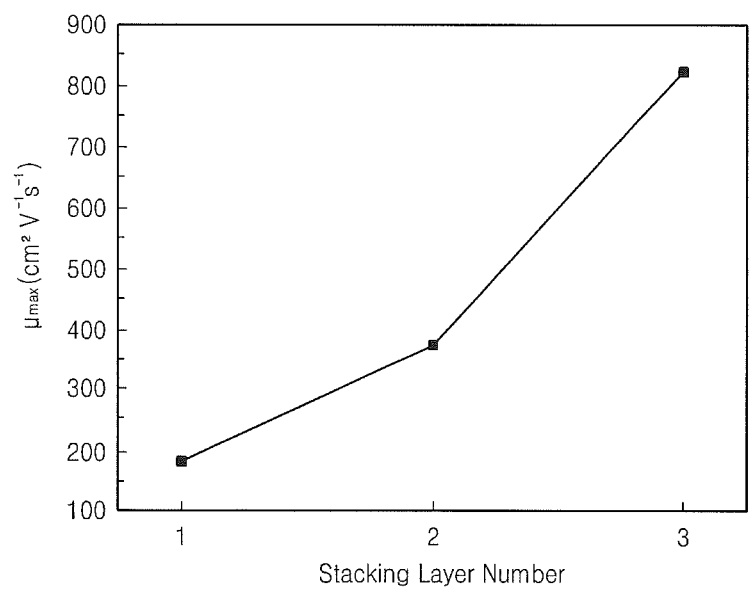
FIG. 10 is a graph illustrating carrier mobility versus the number of single graphene layers included in a graphene channel layer of an embodiment of the photodetector according to the invention.

FIG. 10 is a graph illustrating carrier mobility μ versus the number of single graphene layers included in the graphene channel layer of an embodiment of the photodetector according to the invention. In FIG. 10, a horizontal axis indicates the number of single graphene layers included in the graphene channel layer, and a vertical axis indicates the carrier mobility (centimeters squared per volt-second: $cm^2V^{-1}s^{-1}$).

Referring to FIG. 10, the carrier mobility increases as the number of single graphene layers included in the graphene channel layer increases.

Figure 11:
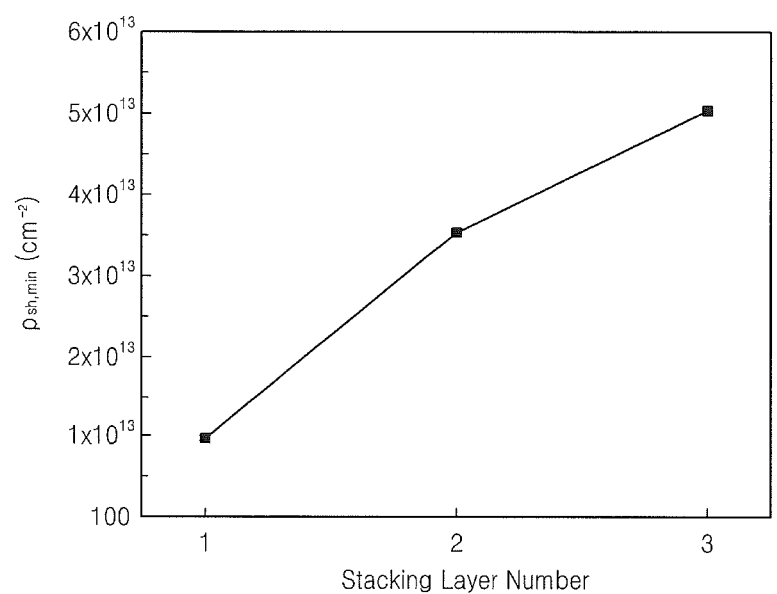
FIG. 11 is a graph illustrating carrier sheet density versus the number of single graphene layers included in a graphene channel layer of an embodiment of the photodetector according to the invention.

FIG. 11 is a graph illustrating carrier sheet density $\rho_{sh}$ versus the number of single graphene layers included in an embodiment of the graphene channel layer of the photodetector according to the invention. In FIG. 11, a horizontal axis indicates the number of single graphene layers included in the graphene channel layer, and a vertical axis indicates the carrier sheet density (sheet per square centimeter: $cm^{-2}$).

Referring to FIG. 11, the carrier sheet density increases as the number of single graphene layers included in the graphene channel layer increases.

Figure 12:
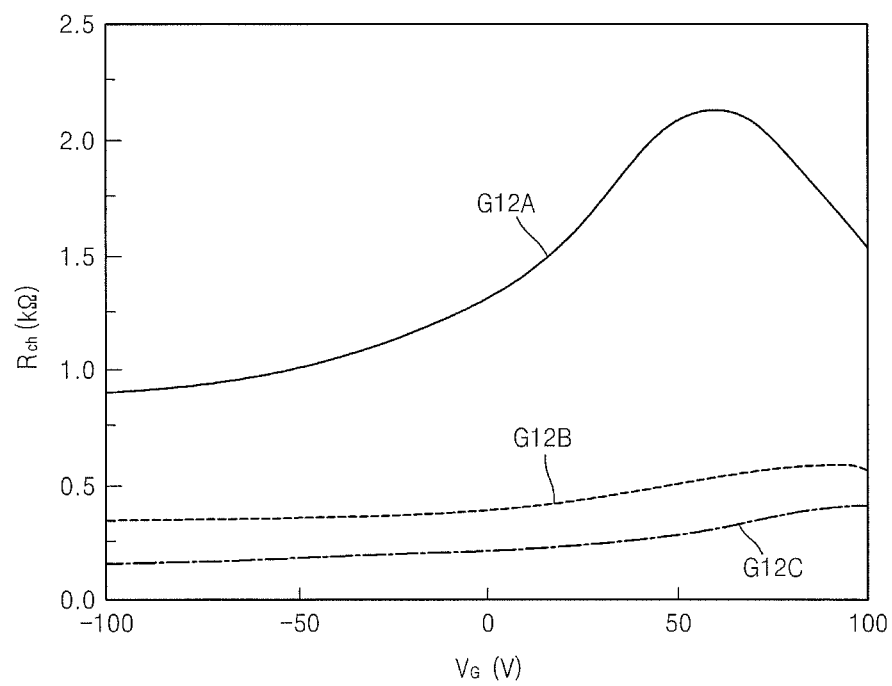
FIG. 12 is a graph illustrating resistance $R_{ch}$ of a graphene channel layer versus the number of single graphene layers included in a graphene channel layer of an embodiment of the photodetector according to the invention.

FIG. 12 is a graph illustrating resistance $R_{ch}$ of the graphene channel layer versus the number of single graphene layers included in the graphene channel layer of an embodiment of the photodetector according to the invention. In FIG. 12, the graph was obtained by applying a drain voltage of about 2.0 V to the second electrode 38 and maintaining the drain voltage of about 2.0 V until measurement was completed. A horizontal axis of FIG. 12 indicates a gate voltage $V_G$ (V), and a vertical axis of FIG. 12 indicates the resistance $R_{ch}$ of the graphene channel layer (kilohm: kΩ). In FIG. 12, a first graph G12A indicates a result when the number of single graphene layers included in the graphene channel layer is 1. A second graph G12B indicates a result when the number of single graphene layers included in the graphene channel layer is 2. A third graph G12C indicates a result when the number of single graphene layers included in the graphene channel layer is 3.

Referring to the first through third graphs G12A through G12C, the resistance $R_{ch}$ of the graphene channel layer decreases as the number of single graphene layers included in the graphene channel layer increases.

Figure 13:
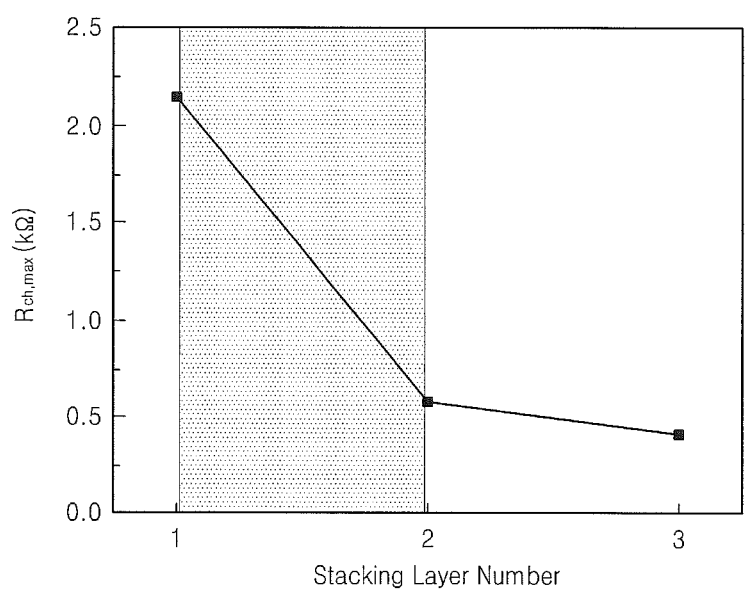
FIG. 13 is a graph illustrating a maximum resistance $R_{ch\_max}$ of a graphene channel layer versus the number of single graphene layers included in a graphene channel layer of an embodiment of the photodetector according to the invention.

FIG. 13 is a graph illustrating a maximum resistance $R_{ch.max}$ of the graphene channel layer versus the number of single graphene layers included in the graphene channel layer of an embodiment of the photodetector according to the invention. In FIG. 13, a horizontal axis indicates the number of single graphene layers included in the graphene channel layer, and a vertical axis indicates the maximum resistance $R_{ch.max}$ of the graphene channel layer (kΩ).

Referring to FIG. 13, a change of the maximum resistance $R_{ch.max}$ when the number of single graphene layers included in the graphene channel layer is changed from 1 to 2 is larger than a change of the maximum resistance $R_{ch.max}$ when the number of single graphene layers included in the graphene channel layer is changed from 2 to 3.

Figure 14:
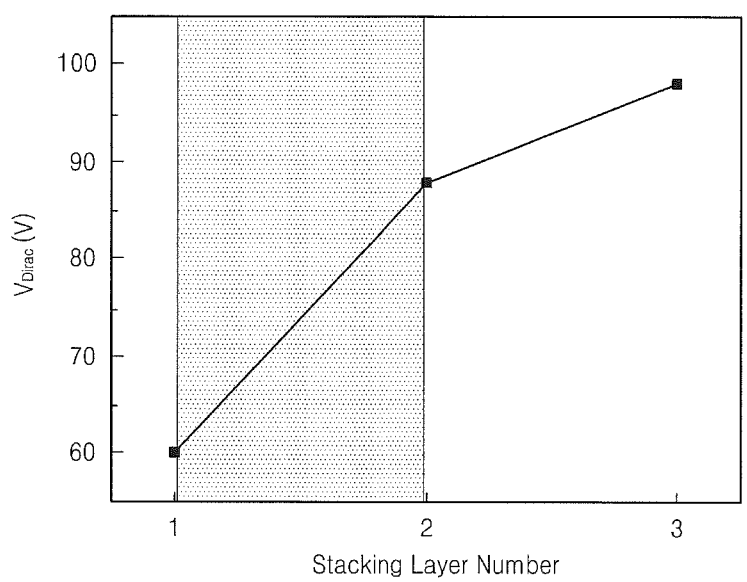
FIG. 14 is a graph illustrating a Dirac point voltage $V_{dirac}$ versus the number of single graphene layers included in a graphene channel layer of an embodiment of the photodetector according to the invention.

FIG. 14 is a graph illustrating a Dirac point voltage $V_{dirac}$ versus the number of single graphene layers included in the graphene channel layer of an embodiment of the photodetector according to the invention. In FIG. 14, a horizontal axis indicates the number of single graphene layers included in the graphene channel layer, and a vertical axis indicates the Dirac point voltage $V_{dirac}$ (V).

Referring to FIG. 14, a change of the Dirac point voltage $V_{dirac}$ when the number of single graphene layers included in the graphene channel layer is changed from 1 to 2 is larger than a change of the Dirac point voltage $V_{dirac}$ when the number of single graphene layers included in the graphene channel layer is changed from 2 to 3.

As shown in FIGS. 13 and 14, a second stacked single graphene layer, i.e., a second single graphene layer, of a plurality of single graphene layers included in the graphene channel layer provides a buffer layer effect. In such an embodiment, a buffer layer effect, in which a rapid change of a measured value due to an increase in the number of single graphene layers is buffered, appears due to the existence of the second single graphene layer.

Figure 15:
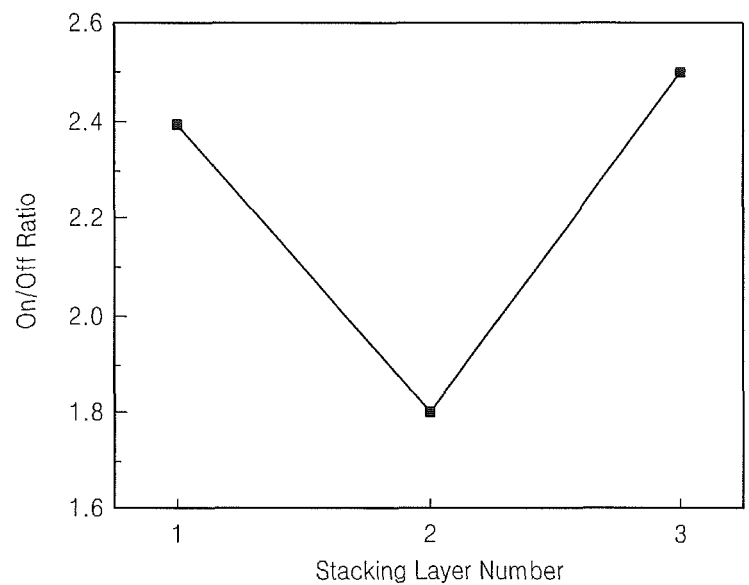
FIG. 15 is a graph illustrating an On/Off ratio versus the number of single graphene layers included in a graphene channel layer of an embodiment of the photodetector according to the invention.

FIG. 15 is a graph illustrating an On/Off ratio versus the number of single graphene layers included in the graphene channel layer of an embodiment of the photodetector according to the invention. In FIG. 15, a horizontal axis indicates the number of single graphene layers included in the graphene channel layer, and a vertical axis indicates the On/Off ratio.

Referring to FIG. 15, a downward sharp tip appears when the number of single graphene layers is 2. As shown in FIG. 15, a second single graphene layer of a plurality of single graphene layers included in the graphene channel layer provides a buffer layer effect.

Figure 16:
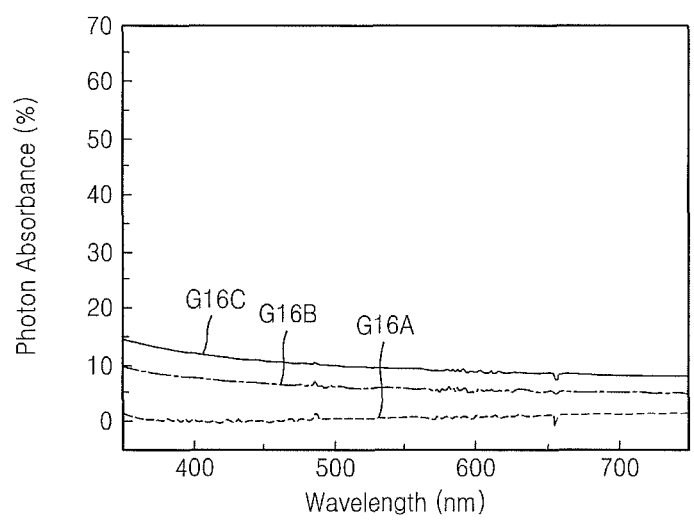
FIG. 16 is a graph illustrating photon absorbance versus the number of single graphene layers included in a graphene channel layer of an embodiment of the photodetector according to the invention.

FIG. 16 is a graph illustrating photon absorbance versus the number of single graphene layers included in the graphene channel layer of an embodiment of the photodetector according to the invention. In FIG. 16, a horizontal axis indicates a wavelength of light (nm) incident on the graphene channel layer of the photodetector, and a vertical axis indicates the photon absorbance (percent: %).

A first graph G16A shown in FIG. 16 indicates photon absorbance when the number of single graphene layers included in the graphene channel layer is 1. A second graph G16B indicates photon absorbance when the number of single graphene layers included in the graphene channel layer is 2, and a third graph G16C indicates photon absorbance when the number of single graphene layers included in the graphene channel layer is 3.

Referring to the first through third graphs G16A through G16C, the photon absorbance of the graphene channel layer increases as the number of single graphene layers included in the graphene channel layer increases. As shown in the first through third graphs G16A through G16C, the graphene channel layer absorbs light having a wide wavelength bandwidth from an infrared domain to an ultraviolet domain.

Figure 17:
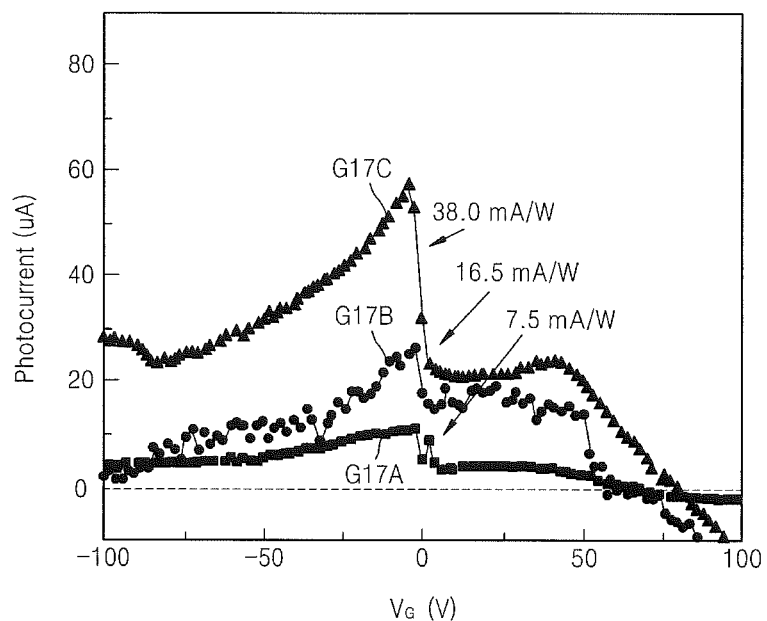
FIG. 17 is a graph illustrating a photocurrent versus the number of single graphene layers included in a graphene channel layer of an embodiment of the photodetector according to the invention.

FIG. 17 is a graph illustrating a photocurrent versus the number of single graphene layers included in the graphene channel layer of an embodiment of the photodetector according to the invention. In FIG. 17, the graph was obtained by applying a drain voltage of about 2.0 V to the second electrode 38 and maintaining the drain voltage of about 2.0 V until measurement was completed.

In FIG. 17, a horizontal axis indicates a gate voltage $V_G$ (V) and a vertical axis indicates the photocurrent (uA: microampere). In FIG. 12, a first graph G17A indicates the photocurrent when the number of single graphene layers included in the graphene channel layer is 1. A second graph G17B indicates the photocurrent when the number of single graphene layers included in the graphene channel layer is 2. A third graph G17C indicates the photocurrent when the number of single graphene layers included in the graphene channel layer is 3. Referring to the first through third graphs G17A through G17C, the photocurrent rapidly increases as the number of single graphene layers included in the graphene channel layer increases. As a result, the transport of carriers and the photon absorbance are improved as the number of single graphene layers included in the graphene channel layer increases.

Next, an embodiment of a method of manufacturing a photodetector according to the invention will be described with reference to FIGS. 18 through 21. In FIGS. 18 through 21, reference numerals used for elements of the embodiments of the photodetector described above are used as already given, and any repetitive description of the reference numerals will be omitted.

Figure 18:
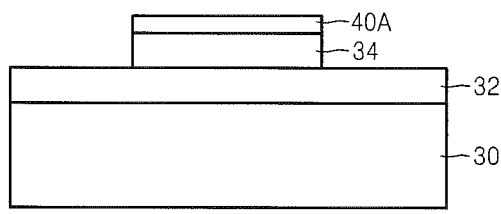
FIGS. 18 through 21 are cross-sectional views illustrating an embodiment of a method of manufacturing a photodetector according to the invention.

Referring to FIG. 18, an insulation layer 32 is provided, e.g., formed, on a substrate 30, which is used as a gate electrode. The insulation layer 32 is used as a gate insulation layer, and may include silicon oxide or nitride. A first channel layer 34 is provided on the insulation layer 32. The first channel layer 34 may be a first graphene layer. In an embodiment, the first channel layer 34 may be a single graphene layer. The first channel layer 34 may be provided by transferring a single graphene layer, which is formed using a predetermined method, for example, a chemical vapor deposition ("CVD") method, on the insulation layer 32. The first channel layer 34 may be provided by stacking a plurality of single graphene layers using the transferring method. In one embodiment, for example, a first single graphene layer (not shown) may be formed using the CVD method and may be transferred on the insulation layer 32, and then a second single graphene layer (not shown) may be formed using the CVD method and be transferred onto the first single graphene layer. Since the plurality of single graphene layers provided in such manner is simply and physically stacked without a chemical combination, π-binding is not formed between the single graphene layers. When providing the first channel layer 34 by simply stacking a plurality of single graphene layers, nanoparticles may be provided between respective single graphene layers. In one embodiment, for example, after transferring the first single graphene layer on the insulation layer 32, nanoparticles may be provided, e.g., formed, on the first single graphene layer. Next, the second single graphene layer covering the nanoparticles may be transferred onto the first single graphene layer. An embodiment of a method of forming nanoparticles will be described below. The first channel layer 34 may be provided on substantially an entire of the upper surface of the insulation layer 32.

Next, a metal layer 40A is formed on the first channel layer 34 to provide nanoparticles. The metal layer 40A may include, for example, gold (Au) or silver (Ag). The thickness of the metal layer 40A may be determined based on diameters of nanoparticles to be finally provided. A resultant structure in which the metal layer 40A has been formed is annealed in a nitrogen (N₂) atmosphere. The annealing may be performed for a predetermined period of time under a predetermined temperature until the nanoparticles are formed. In one embodiment, for example, the annealing may be performed for about one hour under about 300° C. In such an embodiment, the temperature and time may be changed. Process conditions of the annealing, such as gas atmosphere, temperature, time and the like, may be changed depending on a material of the metal layer 40A. During the annealing, a surface tension appears on the surface of the metal layer 40A. Thus, the metal layer 40A is divided into nanoparticles.

Figure 19:
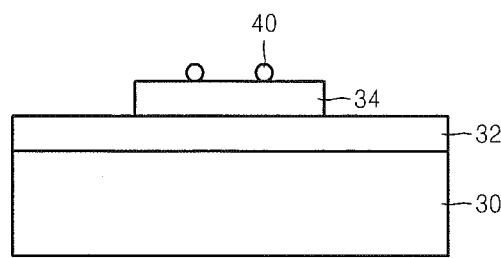

In such a manner, nanoparticles 40 are provided on the first channel layer 34 as illustrated in FIG. 19.

Figure 20:
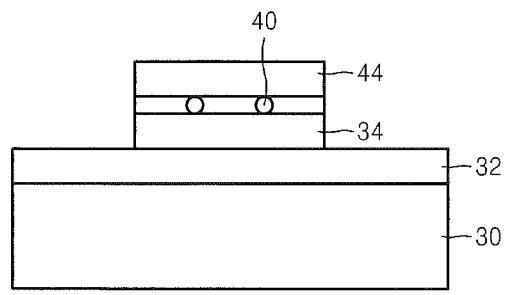

Next, referring to FIG. 20, a second channel layer 44 covering the nanoparticles 40 is provided on the first channel layer 34. The second channel layer 44 may be a second graphene layer. In an embodiment, the second channel layer 44 may include one single graphene layer. In an alternative embodiment, the second channel layer 44 may include a plurality of single graphene layers sequentially stacked simply and physically without a chemical combination. In such an embodiment, nanoparticles may be further provided between the plurality of single graphene layers using the method described above. In such an embodiment, a layer structure of the second channel layer 44 may be substantially similar to or the same as a layer structure of the first channel layer 34.

Figure 21:
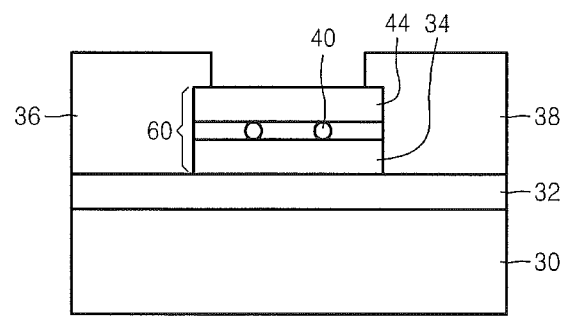

Next, as illustrated in FIG. 21, first and second electrodes 36 and 38 that contact a channel layer 60 are provided on the insulation layer 32. The first electrode 36 may be disposed to contact one side of the channel layer 60. The first electrode 36 may partially overlap the channel layer 60. The second electrode 38 may be disposed to contact another side of the channel layer 60. The second electrode 38 may partially overlap the channel layer 60. The first and second electrodes 36 and 38 may face each other. If the channel layer 60 is provided to cover the whole upper surface of the insulation layer 32, both the first and second electrodes 36 and 38 may be provided on the channel layer 60. Nanoparticles (not shown) may be provided on the second channel layer 44 before providing the first and second electrodes 36 and 38 on the insulation layer 32, and a third channel layer (not shown) covering the nanoparticles may be further provided. In such a manner, fourth through N-th channel layers (where N is a positive integer that is equal to or greater than 5) may be further provided, and nanoparticles may be provided between the further provided channel layers. Layer structures of the third channel layer and the further provided channel layers may be substantially similar to or the same as the layer structure of the first channel layer 34.

Although not illustrated in FIGS. 18 through 21, in an alternative embodiment, the substrate 30, which is used as the gate electrode, and the insulation layer 32 may be provided on the channel layer 60 such that a photodetector having a top gate structure may be provided.

It should be understood that the embodiments described herein should be considered in a descriptive sense only and not for purposes of limitation. Descriptions of features or aspects within each embodiment should typically be considered as available for other similar features or aspects in other embodiments.

What is claimed is:

1. A photodetector comprising:
    a gate electrode;
    a graphene channel layer which is opposite to and spaced apart from the gate electrode and does not have π-binding;
    a first electrode which contacts a first side of the graphene channel layer; and
    a second electrode which contacts a second side of the graphene channel layer, wherein the first and second sides are opposite to each other,
    wherein the graphene channel layer comprises:
    a first graphene layer; and
    a first nanoparticle disposed on the first graphene layer.

2. The photodetector of claim 1, wherein the first graphene layer comprises a single graphene layer.

3. The photodetector of claim 1, wherein the first graphene layer comprises a plurality of graphene layers, which is sequentially stacked and does not have the π-binding.

4. The photodetector of claim 3, further comprising a second nanoparticle between the plurality of graphene layers.

5. The photodetector of claim 1, wherein the graphene channel layer further comprises a second graphene layer which covers the first nanoparticle on the first graphene layer.

6. The photodetector of claim 4, wherein the first nanoparticle and the second nanoparticle are the same as or different from each other.

7. The photodetector of claim 5, wherein the second graphene layer comprises a single graphene layer.

8. The photodetector of claim 5, wherein the second graphene layer comprises a plurality of graphene layers, which is sequentially stacked and does not have the π-binding.

9. The photodetector of claim 8, further comprising a third nanoparticle between the plurality of graphene layers in the second graphene layer.

10. The photodetector of claim 9, wherein the first nanoparticle and the third nanoparticle are the same as or different from each other.

11. The photodetector of claim 1, wherein the first and second electrodes comprise a same material.

12. The photodetector of claim 1, wherein the gate electrode comprises a P-type or N-type silicon electrode.

13. The photodetector of claim 1, wherein the first nanoparticle comprises gold (Au) or silver (Ag).

14. The photodetector of claim 1, wherein the gate electrode is disposed above or under the graphene channel layer.

15. A method of manufacturing a photodetector, the method comprising:
    providing a graphene channel layer;
    providing a gate electrode opposite to the graphene channel layer;
    providing a first electrode which is spaced apart from the gate electrode and contacts a first side of the graphene channel layer; and
    providing a second electrode which is spaced apart from the gate electrode and contacts a second side of the graphene channel layer, wherein the first and second sides are opposite to each other,- wherein the providing the graphene channel layer comprises:

providing a first graphene layer which does not have π-binding; and providing a first nanoparticle on the first graphene layer.

16. The method of claim 15, wherein the gate electrode is provided above or under the graphene channel layer.

17. The method of claim 15, wherein the providing the first graphene layer comprises:

forming a single graphene layer; and transferring the formed single graphene layer to a location where the graphene channel layer is to be provided.

18. The method of claim 15, wherein the providing the first graphene layer comprises:

forming a first single graphene layer;

transferring the formed first single graphene layer to a location where the graphene channel layer is to be provided;

forming a second single graphene layer; and transferring the formed second single graphene layer onto the first single graphene layer.

19. The method of claim 18, wherein the providing the first graphene layer further comprises:

providing a second nanoparticle on the formed first single graphene layer before the transferring the formed second single graphene layer onto the first single graphene layer.

20. The method of claim 15, wherein the providing the graphene channel layer further comprises providing a second graphene layer which covers the first nanoparticle on the first graphene layer.

21. The method of claim 19, wherein the first nanoparticle and the second nanoparticle are the same as or different from each other.

22. The method of claim 20, wherein the providing the second graphene layer comprises:

forming a third single graphene layer; and transferring the formed third single graphene layer onto the first graphene layer to cover the first nanoparticle.

23. The method of claim 20, wherein the providing the second graphene layer comprises:

forming a fourth single graphene layer;

transferring the formed fourth single graphene layer onto the first graphene layer to cover the first nanoparticle;

forming a fifth single graphene layer; and transferring the formed fifth single graphene layer onto the fourth single graphene layer.

24. The method of claim 23, wherein the providing the second graphene layer further comprises:

providing a third nanoparticle on the fourth single graphene layer before the transferring the formed fifth single graphene layer onto the fourth single graphene layer.

25. The method of claim 24, wherein the first nanoparticle and the third nanoparticle are the same as or different from each other.

26. The method of claim 18, wherein a single graphene layer is further provided on the second single graphene layer.

27. The method of claim 20, wherein the providing the graphene channel layer further comprises:

providing a third nanoparticle on the second graphene layer; and providing a graphene layer which covers the third nanoparticle on the second graphene layer.

28. The method of claim 23, further comprising:

providing a single graphene layer on the fifth single graphene layer.

29. The method of claim 15, wherein the providing the first nanoparticle on the first graphene layer comprises:

forming a metal layer to form the first nanoparticle on the first graphene layer; and annealing the metal layer.

30. The method of claim 15, wherein the first nanoparticle comprises gold (Au) or silver (Ag).

31. The method of claim 15, wherein the first and second electrodes comprise a same material.

* * * * *